US006848139B2

(12) United States Patent
Simon et al.

(10) Patent No.: US 6,848,139 B2
(45) Date of Patent: Feb. 1, 2005

(54) COMBINATION HAND TOOL AND ELECTRICAL TESTING DEVICE

(76) Inventors: Rodolphe Simon, 100 Goff St., Dexter, ME (US) 04930; Peter Seamans, Dexter Rd., St. Albans, ME (US) 04971

( * ) Notice: Subject to any disclaimer, the term of this patent is extended or adjusted under 35 U.S.C. 154(b) by 20 days.

(21) Appl. No.: 10/426,856

(22) Filed: May 1, 2003

(65) Prior Publication Data

US 2004/0216239 A1 Nov. 4, 2004

(51) Int. Cl.[7] ............................................. B25B 7/22
(52) U.S. Cl. ............................ 7/127; 7/107; 81/427.5
(58) Field of Search .................... 7/107, 127; 81/427.5

(56) References Cited

U.S. PATENT DOCUMENTS

| 1,503,536 | A | * | 8/1924 | Klauke ..................... 81/427.5 |
| 3,775,677 | A | | 11/1973 | Garrett et al. |
| 4,250,446 | A | | 2/1981 | Ponte |
| 4,736,480 | A | * | 4/1988 | Bohl et al. ..................... 7/107 |
| 5,051,876 | A | | 9/1991 | Norman |

* cited by examiner

Primary Examiner—James G. Smith
(74) Attorney, Agent, or Firm—Anthony D. Pellegrini

(57) ABSTRACT

The invention is directed to a device combining a handled tool, such as wire strippers, with one or more testing components useful for testing electrical circuits, such as continuity testers and voltage detectors, with the testing components integrated into a like number of handle grips.

16 Claims, 5 Drawing Sheets

COMBINATION HAND TOOL AND ELECTRICAL TESTING DEVICE

BACKGROUND OF THE INVENTION

1. Technical Field

The invention relates generally to hand tools commonly used by electricians and others who work with electrical wiring and circuits, and more particularly to the combination of such tools with useful testing devices commonly used by such users.

2. Description of Prior Art

Combination hand tools are well known in the art. Within the field of combination hand tools are tools combining testing components useful for testing electrical circuits. One example is found in U.S. Pat. No. 3,775,677, dated Nov. 27, 1973, to David C. Garrett, et al. The '677 patent combines a continuity tester with a flashlight. The continuity tester is integrated with the flashlight and interrupts the function of the flashlight when it is being used to test circuits. U.S. Pat. No. 4,250,446, dated Feb. 10, 1981, to Raymon Ponte also discloses a continuity tester combined with a flashlight. The '446 patent improves upon the '677 patent by also providing a clamping structure to hold the flashlight in place for hands-free operation. U.S. Pat. No. 5,051,876, dated Sep. 24, 1991, to Keith Norman, discloses a combination device incorporating a continuity tester with a flashlight and another tool, such as a screwdriver or a socket holder.

Each of the foregoing patents involve complicated devices integrated with flashlights. Each is configured to incorporate continuity testers but no other type of electrical circuit tester. The claimed device surmounts these deficiencies in the prior art by allowing the testing component to be integrated with hand tools other than flashlights, and to incorporate testing components in addition to continuity testers. Moreover, the simplified design of the combination device allows for low cost mass production, thereby improving on the overly complicated designs of the prior art and making the claimed device an attractive tool for persons working with electrical circuits.

SUMMARY

In one aspect, the invention is directed to a device combining a handled tool, such as wire strippers, wire cutters, pliers, and the like, with a testing component suitably adapted to test electrical circuits, said testing component integrated into a handle grip.

This aspect may include one or more of the following features: the handle grip having interior pockets suitably adapted to accommodate the tool handle and the testing component, with an insulated wall separating the pockets; the handle grip having reinforcing ribs; the testing component having a power source and an indicator; the power source of the testing component being a single battery or a pair of batteries; the indicator of the testing component being a lamp or a buzzer; the testing component being a continuity tester; the continuity tester being further comprised of a first contact plate, a second contact plate, a plurality of wires, and a base strip; the continuity tester being further comprised of a first tester lead and a second tester lead; the continuity tester being further comprised of a printed circuit board, having integrated thereon a first integrated contact plate, a second integrated contact plate, and an indicator; the testing component being a voltage detector; and the handle grip having apertures to provide access to the testing component.

In another aspect, the invention is directed to a device combining a handled tool, such as wire strippers, wire cutters, pliers, and the like, with two testing components suitably adapted to test electrical circuits, said testing components being a continuity tester and a voltage detector, and said testing components integrated into a pair of handle grips, one testing component per handle grip.

Other features and advantages of the invention are described below.

DESCRIPTION OF THE INVENTION

Figure 1:
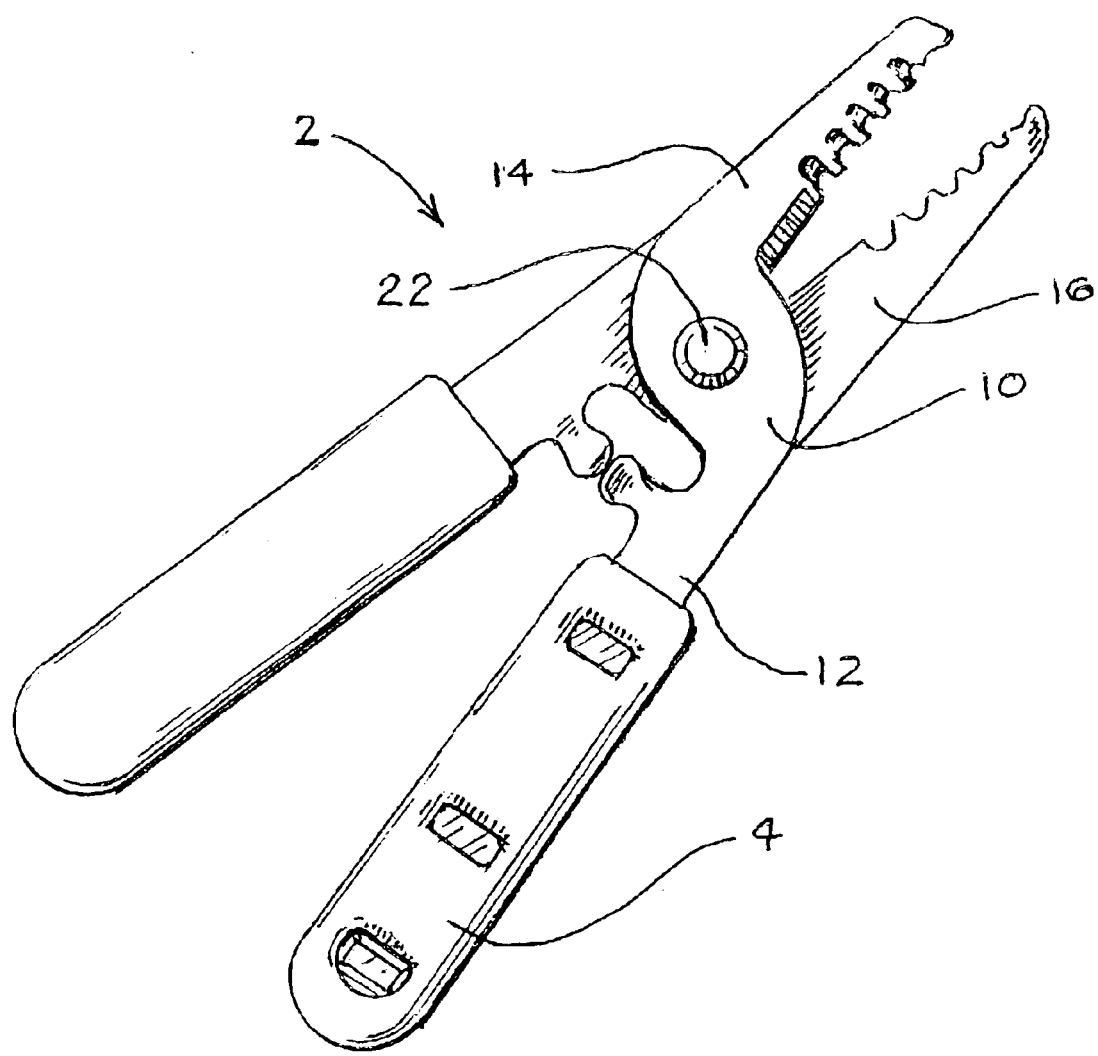
FIG. 1 is a plan view of the combination device utilizing a single testing component.

FIG. 1 shows a plan view of one embodiment of the combination device. The device is a combination of a handled tool 2, a testing component 6, and a handle grip 4. The handled tool 2 is any hand tool having a first member 10 and a second member 16, with the first member 10 having a handle end 12 and a working end 14 and the second member 16 having a handle end and a working end, such that the first member 10 is pivotally connected to the second member 16 at a pivot point 22. The handled tool 2 is operated by manual manipulation of the handle ends of the first and second members 10,16. Examples of such tools are wire cutters, pliers, scissors, and the like. In the preferred embodiment, the handled tool 2 is a pair of wire strippers. No claim is made on the handled tool 2 independent of the combination.

Figure 2:
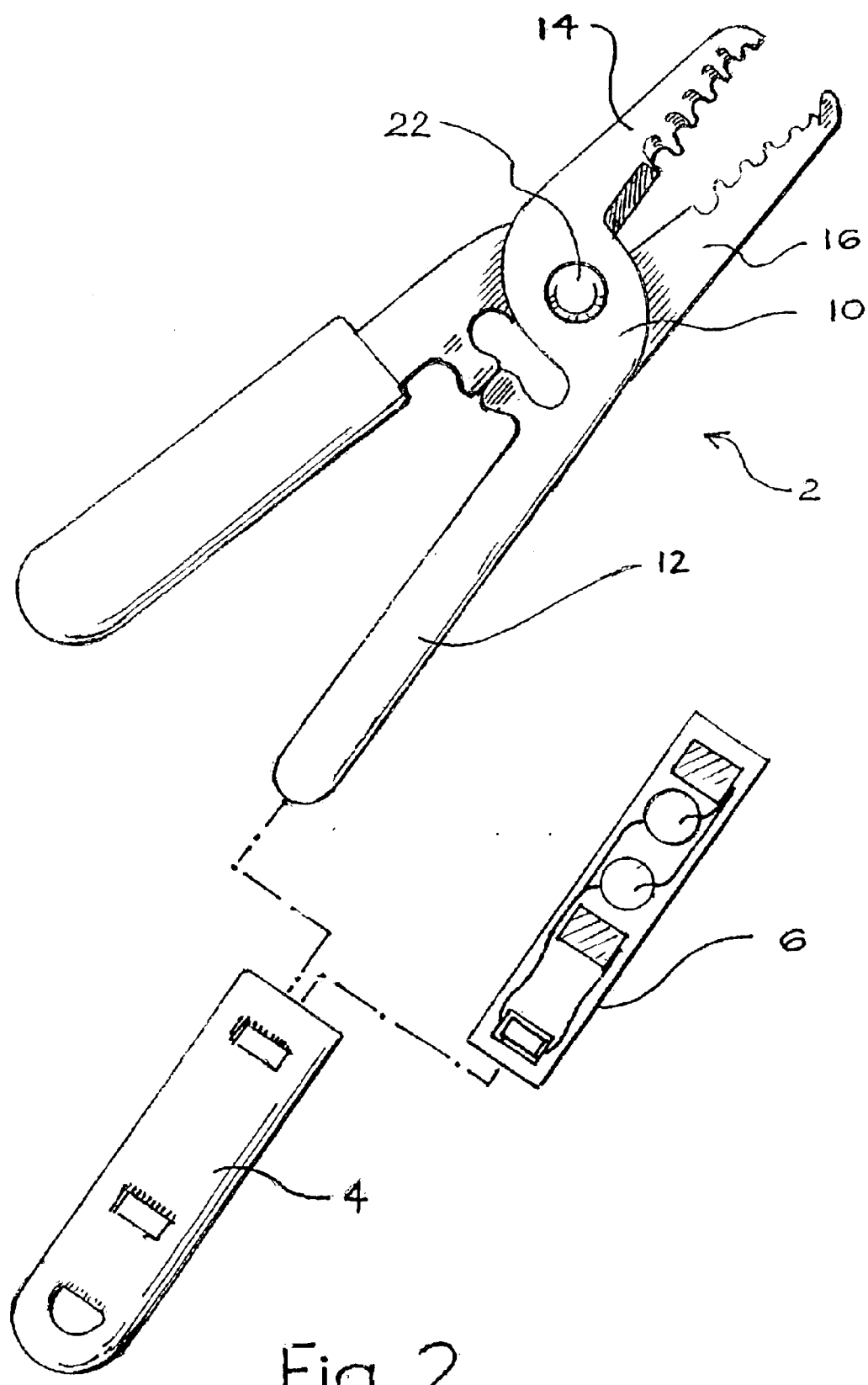
FIG. 2 is an exploded view of the combination device shown in FIG. 1, showing the individual components of the combination device, i.e., a handled tool, a handle grip, and a testing component.

The testing component 6 is combined with the handled tool 2 by the handle grip 4, as shown in FIG. 2. The handle grip 4 is suitably adapted to fit over the handle end 12 of the first member 10 of the handled tool 2 and suitably adapted to accommodate the testing component 6. So configured, the handle grip 4 provides both a means for integrating the testing component 6 with the handled tool 2 and a means for improving the user's ability to manually grasp the handled tool 2 during use.

Figure 3:
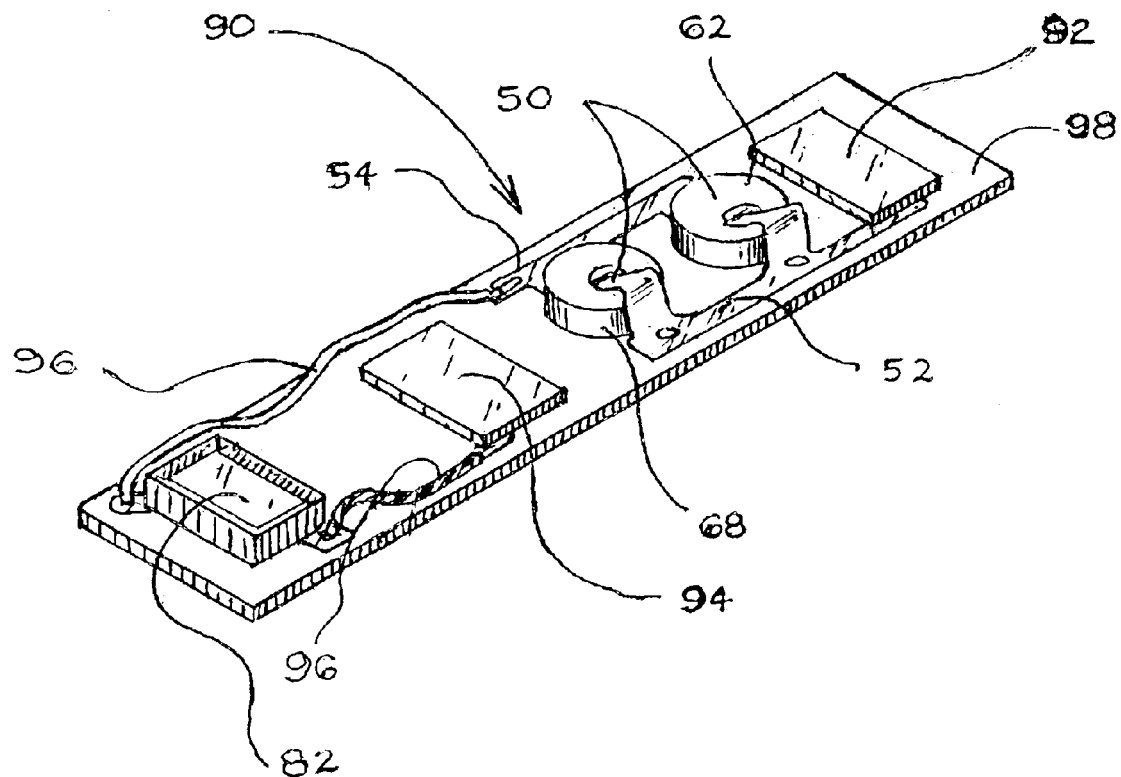
FIG. 3 is a perspective view of the continuity tester embodiment of the testing component.

FIG. 3 shows one embodiment of a testing component 6. The testing component 6 is any simple device suitably adapted to test electrical circuits. In order to accomplish this task, the testing component 6 comprises a power source 50 and an indicator. The power source has a first terminal 52 and a second terminal, whereby the first terminal 52 and second terminal are of opposite polarity. In one embodiment the power source 50 comprises a battery having a first terminal and a second terminal, the first and second terminals of the battery corresponding to the first terminal 52 and second terminal of the power source 50. In the preferred embodiment the power source 50 comprises a pair of batteries 62,68 in parallel, whereby the first and second batteries 62,68 each have a first and second terminal, the first terminals of the first and second batteries 62,68 corresponding to the first terminal 52 of the power source 50, and the second terminals of the first and second batteries 62,68 corresponding to the second terminal of the power source 50. In this embodiment, the batteries 62,68 may be standard button-style batteries. The indicator of the testing component 6 may be a lamp 82 or a buzzer 84. In the preferred embodiment, the indicator is a light emitting diode. In another embodiment the indicator is a piezoelectric buzzer.

In one embodiment of the invention, shown in FIG. 3, the testing component 6 is a continuity tester 90. Such a device is used to determine whether two separate ends of wires are joined in a continuous electrical circuit. Such a continuity tester 90 is necessary when the wires in question travel outside of sight lines, either through walls, floors, ceilings, or other structural members, or within other devices, such that visual determination of a closed electrical circuit is not possible. To determine whether two separate ends of wires are joined in a continuous electrical circuit, the end of one of the wires in question is placed in contact with the power source 50 of the continuity tester 90, and the end of the other wire in question is placed in contact with the indicator of the continuity tester 90. If the wires are joined in a continuous electrical circuit, power from the power source 50 will travel through that circuit and activate the indicator. If the wires are not joined in a continuous electrical circuit, the indicator will not be activated.

In one embodiment, the continuity tester 90 is comprised of the power source 50 and the indicator, and of a first contact plate 92, a second contact plate 94, a plurality of wires 96, and a base strip 98. The first contact plate 92 and the second contact plate 94 are constructed of an electrically conductive material. In one embodiment this material is metallic. In the preferred embodiment, the material is copper. The first and second contact plates 92,94 may be substantially flat and of any suitable shape. In the preferred embodiment the first and second contact plates 92,94 are rectangular. The base strip 98 is constructed of an insulating, non-conductive material and is suitably adapted to accommodate the contact plates 92,94, power source 50, and indicator. In this embodiment, the first contact plate 92 is serially in connection by a wire with the first terminal of the power source 50, the second terminal of the power source 50 is serially in connection by a wire with the indicator, and the indicator is serially in connection by a wire with the second contact plate 94. The first contact plate 92, second contact plate 94, power source 50, and indicator are fixedly attached to the base strip 98.

In another embodiment, the continuity tester 90 is further comprised of a first tester lead and a second tester lead. These leads are constructed of an electrically conductive material, such as a wire. The first tester lead is serially in connection with the first terminal of the power source 50 and the second tester lead is serially in connection with the indicator 80. The leads may have alligator clips on their distal ends. These leads serve as remote alternatives to the first contact plate 92 and the second contact plate 94, allowing the continuity tester 90 to be used on circuits having free wires in difficult to reach locations.

In yet another embodiment, the first contact plate, the second contact plate, and the indicator are integrated into a printed circuit board. The power source 50 is fixedly attached to the printed circuit board. In this embodiment, the first integrated contact plate is serially in connection with the first terminal of the power source 50, the second terminal of the power source 50 is serially in connection with the indicator, and the indicator is serially in connection with the second integrated contact plate.

In another embodiment of the invention, the testing component 6 is a voltage detector 110. Such a device is used to determine whether a wire or an electrical outlet is "live", i.e., has power flowing through it. Such a voltage detector 110 is necessary because working with powered electrical components may present a danger to the electrician, and it is often not evident whether a component is powered. To determine whether an electrical component is powered, the voltage detector 110 is placed in close proximity to the electrical component, while the user activates the voltage detector 110. If the electrical component is powered, the circuit is completed and the indicator is activated. If the electrical component is not powered, the indicator will not be activated.

Figure 5:
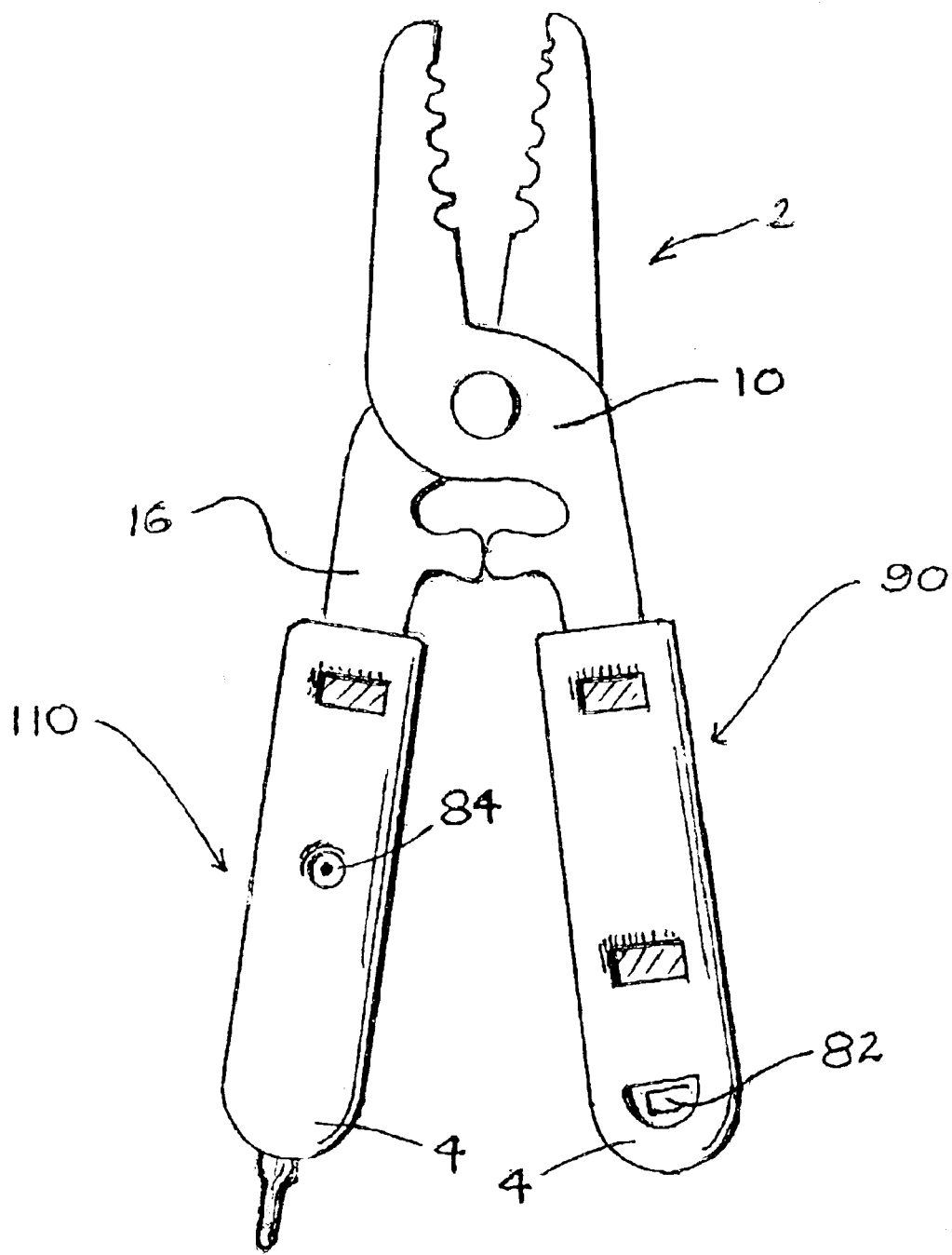
FIG. 5 is a plan view of the combination device utilizing two testing components.

In yet another embodiment of the invention, shown in FIG. 5, the device comprises two testing components 6, a continuity tester 90 and a voltage detector 110, and two handle grips 4. The second handle grip 4 is suitably adapted to fit over the handle end of the second member 16 of the handled tool 2 and suitably adapted to accommodate the testing components 6. Each testing component 6 is placed within one of the handle grips 4.

Figure 4:
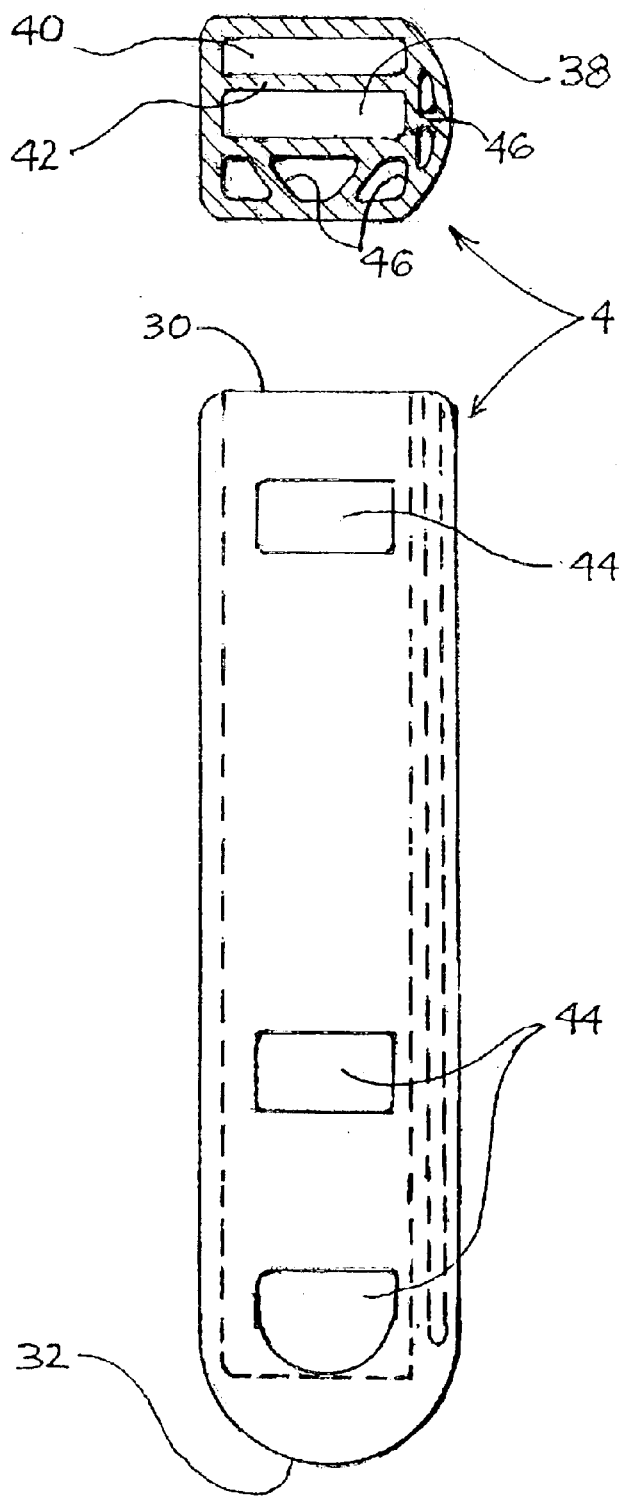
FIG. 4 is a plan view of a handle grip together with a cross sectional view of the handle grip.

FIG. 4 shows the handle grip 4 in detail. The handle grip 4 is constructed of an insulating, non-conducting material, such as rigid plastic, rubberized plastic, polycarbonate, polystyrene, or other like materials. The handle grip 4 has an open first end 30 and a closed second end 32, thereby forming a close-ended tube having an outer skin and an interior space. Within the interior space of the handle grip 4 is formed a handle pocket 38 and a tester pocket 40. The handle pocket 38 is adjacent to the tester pocket 40 and separated from the tester pocket 40 by a common wall 42. The common wall 42 serves as an insulating barrier between the two pockets 38,40. The handle pocket 38 is thus bounded by a portion of the outer skin of the handle grip 4 and the common wall 42, and the tester pocket 40 is bounded by the remaining portion of the outer skin of the handle grip 4 and the common wall 42. So configured, the common wall 42 subdivides the interior space of the handle grip 4 into the handle pocket 38 and the tester pocket 40. The handle pocket 38 is suitably adapted to accommodate the handle end 12 of the first member 10 of the handled tool 2, and the tester pocket 40 is suitably adapted to accommodate the testing component 6. The portion of the outer skin of the handle grip 4 bounding the tester pocket 40 has apertures 44 providing access to the testing component 6.

The handle end 12 of the first member 10 of the handled tool 2 is inserted into the open first end 30 of the handle grip 4 and placed all the way into the handle pocket 38, such that the handle end 12 of the first member 10 of the handled tool 2 contacts the closed second end 32 of the handle grip 4. So inserted, the handle end 12 of the first member 10 is securely encased by the handle grip 4. Friction retains the handle grip 4 onto the handle end 12 of the first member 10 of the handled tool 2. The testing component 6 is inserted into the open first end 30 of the handle grip 4 and placed into the tester pocket 40. Friction retains the testing component 6 within the handle grip 4.

In one embodiment, the handle grip 4 is further comprised of reinforcing ribs 46 situated within the interior space and exterior to the handle pocket 38 and the tester pocket 40. These ribs 46 provide a greater exterior diameter to the handle grip 4, making the handled tool 2 more comfortable to hold and use. When the reinforcing ribs 46 are utilized, interior walls of the handle grip 4 bound those portions of the handle pocket 38 and the tester pocket 40 adjacent to the reinforcing ribs 46, with the reinforcing ribs 46 interposed between these interior walls and the outer skin of the handle grip 4.

In embodiments of the invention comprising a continuity tester 90, the apertures 44 of the handle grip 4 are situated along the outer skin of the handle grip 4 in alignment with the first contact plate 92 (or first integrated contact plate), the second contact plate 94 (or second integrated contact plate), and the indicator of the continuity tester 90.

In the embodiment of the invention comprising two handle grips 4 and two testing components 6, the second handle grip 4 is configured as described above.

Other embodiments not specifically set forth herein are also within the scope of the following claims.

We claim:

1. A device combining
   a handled tool,
   said handled tool having a first member and a second member, the first member having a handle end and a working end and the second member having a handle end and a working end, with the first member pivotally connected to the second member at a pivot point such that the working end of the first member is located on the same side of the pivot point as the working end of the second member,
   whereby the working end of the first member and the working end of the second member are suitably adapted to together comprise a working component of the handled tool, said working component being wire stripping blades, plier jaws, cutter blades, and the like, such that said working component is operated by manual manipulation of the handle ends of the first and second members;
   a testing component,
   said testing component suitably adapted to test electrical circuits,
   with said testing component comprising a power source and an indicator,
   wherein the power source has a first terminal and a second terminal, with the first and second terminals being of opposite polarity; and
   a handle grip,
   said handle grip suitably adapted to accommodate the testing component and to fit over the handle end of the first member, providing both a means for integrating the testing component with the handled tool and a means for improving a user's ability to manually grasp the handled tool during use,
   with said handle grip being constructed of an insulating, non-conducting material having an open first end, a closed second end, an outer skin, an interior space, a handle pocket situated within the interior space, and a tester pocket situated within the interior space adjacent to and sharing a common wall with the handle pocket, such that the common wall subdivides the interior space of the handle grip into the handle pocket and the tester pocket,
   wherein the handle pocket is suitably adapted to accommodate the handle end of the first member,
   the tester pocket is suitably adapted to accommodate the testing component, and
   the outer skin of the handle grip adjacent to the tester pocket has apertures providing access to the testing component.

2. The device of claim 1, wherein the power source comprises a battery having a first terminal and a second terminal, with the first and second terminals being of opposite polarity, whereby the first terminal of the battery is the first terminal of the power source and the second terminal of the battery is the second terminal of the power source.

3. The device of claim 1 wherein the power source comprises
   a first battery, having a first terminal and a second terminal, with the first and second terminals of the first battery being of opposite polarity, and
   a second battery, having a first terminal and a second terminal, with the first terminal of the second battery being of the same polarity as the first terminal of the first battery and the second terminal of the second battery being of the same polarity as the second terminal of the first battery;
   whereby the first terminal of the first battery and the first terminal of the second battery correspond to the first terminal of the power source, and the second terminal of the first battery and the second terminal of the second battery correspond to the second terminal of the power source.

4. The device of claim 1, wherein the indicator is selected from the group comprising a lamp and a buzzer.

5. The device of claim 1, wherein the testing component is a continuity tester.

6. The device of claim 5, wherein the continuity tester is further comprised of
   a first contact plate, constructed of an electrically conductive material;
   a second contact plate, constructed of an electrically conductive material;
   a plurality of wires for connecting the first contact plate to the power source, the power source to the indicator, and the indicator to the second contact plate; and
   a base strip, constructed of an insulating, non-conductive material;
   whereby the first contact plate is serially in connection by a wire with the first terminal of the power source, the second terminal of the power source is serially in connection by a wire with the indicator, the indicator is serially in connection by a wire with the second contact plate, and the first contact plate, second contact plate, power source, and indicator are fixedly attached to the base strip.

7. The device of claim 6, wherein the apertures situated along the outer skin of the handle grip are aligned with the first contact plate, the second contact plate, and the indicator.

8. The device of claim 6, wherein the continuity tester is further comprised of
   a first tester lead, constructed of an electrically conductive material; and
   a second tester lead, constructed of an electrically conductive material;
   whereby the first tester lead is serially in connection with the first terminal of the power source and the second tester lead is serially in connection with the indicator, with the first tester lead serving as a remote alternative top the first contact plate and the second tester lead serving as a remote alternative to the second contact plate.

9. The device of claim 5, wherein the continuity tester is further comprised of
   a printed circuit board, having integrated thereon a first integrated contact plate, a second integrated contact plate, and the indicator,
   whereby the power source is fixedly attached to the printed circuit board, the first integrated contact plate is serially in connection with the first terminal of the power source, the second terminal of the power source is serially in connection with the indicator, and the indicator is serially in connection with the second integrated contact plate.

10. The device of claim 9, wherein the apertures situated along the outer skin of the handle grip are aligned with the first integrated contact plate, the second integrated contact plate, and the indicator.

11. The device of claim 5, further comprising a second testing component; and a second handle grip, said second handle grip suitably adapted to accommodate the second testing component and to fit over the handle end of the second member of the handled tool, providing both a means for integrating the second testing component with the handled tool and a means for improving a user's ability to manually grasp the handled tool during use;

wherein the second handle grip is constructed of an insulating, non-conducting material, has an open first end, a closed second end, an outer skin, an interior space, a handle pocket situated within the interior space, and a tester pocket situated within the interior space adjacent to and sharing a common wall with the handle pocket, such that the common wall subdivides the interior space of the handle grip into the handle pocket and the tester pocket, the handle pocket of the second handle grip is suitably adapted to accommodate the handle end of the second member, the tester pocket of the second handle grip is suitably adapted to accommodate the second testing component, the outer skin of the second handle grip adjacent to the tester pocket has apertures providing access to the second testing component, and the second testing component is a voltage detector.

12. The device of claim 11, wherein the second handle grip is further comprised of reinforcing ribs situated within the interior space and exterior to the handle pocket and the tester pocket.

13. The device of claim 11, wherein the second handle grip is constructed of a material selected from the group comprising rigid plastic, rubberized plastic, polycarbonate, and polystyrene.

14. The device of claim 1, wherein the handle grip is further comprised of reinforcing ribs situated within the interior space and exterior to the handle pocket and the tester pocket.

15. The device of claim 1, wherein the handle grip is constructed of a material selected from the group comprising rigid plastic, rubberized plastic, polycarbonate, and polystyrene.

16. A device, combining a handled tool, said handled tool having a first member and a second member, the first member having a handle end and a working end and the second member having a handle end and a working end, with the first member pivotally connected to the second member at a pivot point such that the working end of the first member is located on the same side of the pivot point as the working end of the second member, whereby the working end of the first member and the working end of the second member are suitably adapted to together comprise a working component of the handled tool, said working component being wire stripping blades, plier jaws, cutter blades, and the like, such that said working component is operated by manual manipulation of the handle ends of the first and second members;

a testing component, said testing component suitably adapted to test electrical circuits, wherein said testing component is a voltage detector; and a handle grip, said handle grip suitably adapted to accommodate the testing component and to fit over the handle end of the first member, providing both a means for integrating the testing component with the handled tool and a means for improving a user's ability to manually grasp the handled tool during use, with said handle grip being constructed of an insulating, non-conducting material selected from the group comprising rigid plastic, rubberized plastic, polycarbonate, and polystyrene, said handle grip having an open first end, a closed second end, an outer skin, an interior space, a handle pocket situated within the interior space, and a tester pocket situated within the interior space adjacent to and sharing a common wall with the handle pocket, such that the common wall subdivides the interior space of the handle grip into the handle pocket and the tester pocket, wherein the handle pocket is suitably adapted to accommodate the handle end of the first member, the tester pocket is suitably adapted to accommodate the testing component, and the outer skin of the handle grip adjacent to the tester pocket has apertures providing access to the testing component.

\* \* \* \* \*